United States Patent
Takizawa et al.

(10) Patent No.: US 6,704,075 B2
(45) Date of Patent: Mar. 9, 2004

(54) COLOR FILTER SUBSTRATE, METHOD OF FABRICATING COLOR FILTER SUBSTRATE, LIQUID CRYSTAL DEVICE, METHOD OF FABRICATING LIQUID CRYSTAL DEVICE, AND ELECTRONIC APPARATUS

(75) Inventors: Keiji Takizawa, Hotaka-machi (JP); Yoshio Yamaguchi, Matsumoto (JP); Mutsumi Matsuo, Misato-mura (JP); Takeyoshi Ushiki, Shiojiri (JP)

(73) Assignee: Seiko Epson Corporation (JP)

( * ) Notice: Subject to any disclaimer, the term of this patent is extended or adjusted under 35 U.S.C. 154(b) by 257 days.

(21) Appl. No.: 09/778,011

(22) Filed: Feb. 6, 2001

(65) Prior Publication Data

US 2001/0033441 A1 Oct. 25, 2001

(30) Foreign Application Priority Data

Feb. 14, 2000 (JP) ........................ 2000-035193

(51) Int. Cl.[7] ............................................. G02F 1/1335
(52) U.S. Cl. ........................................ 349/106; 349/113
(58) Field of Search ................... 349/106, 113, 349/114

(56) References Cited

U.S. PATENT DOCUMENTS

| | | | |
|---|---|---|---|
| 5,242,558 A | * | 9/1993 | Matsushima et al. ....... 205/766 |
| 5,501,900 A | * | 3/1996 | Harada et al. .............. 428/323 |
| 5,505,792 A | * | 4/1996 | Ouyang et al. ............. 148/241 |
| 5,757,451 A | | 5/1998 | Miyazaki et al. |
| 5,840,449 A | | 11/1998 | Zambounis et al. |
| 6,280,683 B1 | * | 8/2001 | Hendrickson et al. ........ 419/37 |
| 6,476,888 B2 | * | 11/2002 | Yamanashi .................. 349/106 |

FOREIGN PATENT DOCUMENTS

| | | | | |
|---|---|---|---|---|
| JP | 62215924 A | * | 9/1987 | .......... G02F/1/133 |
| JP | 03203971 A | * | 9/1991 | .......... C09D/11/02 |
| JP | 5-196946 | | 8/1993 | |
| JP | 06102411 A | * | 4/1994 | .......... G02B/5/20 |
| JP | 08327998 A | * | 12/1996 | ......... G02F/1/1335 |
| JP | 63092921 A | * | 4/1998 | .......... G02F/1/133 |
| JP | 11-242238 | | 9/1999 | |
| WO | WO97/48024 | | 12/1997 | |

OTHER PUBLICATIONS

Examination results from corresponding Korean application.

Communication from Taiwan Patent Office regarding counterpart application.

* cited by examiner

Primary Examiner—Kenneth Parker
(74) Attorney, Agent, or Firm—Harness, Dickey & Pierce P.L.C.

(57) ABSTRACT

A color filter substrate 8 having a plurality of pixels $D_1$ includes a reflecting layer 4 composed of a metal film formed on a substrate 2, and any one of blue, green, and red color filter layers 10, 12, and 14 formed on the reflecting layer 4 at a position corresponding to each pixel $D_1$. A metal complex of phthalocyanine is applied to the surface of the reflecting layer 4 at the interface with each color filter layer.

18 Claims, 9 Drawing Sheets

COLOR FILTER SUBSTRATE, METHOD OF FABRICATING COLOR FILTER SUBSTRATE, LIQUID CRYSTAL DEVICE, METHOD OF FABRICATING LIQUID CRYSTAL DEVICE, AND ELECTRONIC APPARATUS

BACKGROUND OF THE INVENTION

1. Technical Field of the Invention

The present invention relates to a color filter substrate having a reflecting layer, a method of fabricating a color filter substrate, a liquid crystal device, a method of forming a liquid crystal device, and an electronic apparatus.

2. Description of the Related Art

In a liquid crystal device, a liquid crystal is interposed between a pair of substrates which are opposed to each other, and light passing through the liquid crystal is modulated in response to the alignment state of the liquid crystal, and thus a display is performed. As the display mode of such a liquid crystal display device, a reflective mode, a transmissive mode, and a transflective mode having characteristics of both modes are known.

In a transmissive liquid crystal device shown in FIG. 11, transparent electrodes 280 composed of ITO (indium tin oxide) or the like are disposed on each of the opposing surfaces of a substrate 220 and a counter substrate 240, and a color filter layer 320 is interposed between the substrate 220 and the transparent electrode 280 on the side of the substrate 220. By controlling the alignment state of liquid crystal molecules in a liquid crystal 260, light emitted from a light source (backlight) 400 provided at the exterior of the substrate 220 is modulated by the liquid crystal 260 and is transmitted to the counter substrate 240 side, and thus a color image is displayed.

In a reflective liquid crystal device, for example, disclosed in Japanese Unexamined Patent Application Publication No. 6-230364, as shown in FIG. 12, a color filter layer 320 is formed under a transparent electrode on the side of a substrate 220, and a light-reflecting metal film (reflecting layer) 300 is provided between the color filter layer 320 and the substrate 220. When external light 420, which enters from the side of a counter substrate 240, and which is transmitted through a liquid crystal 260, is reflected from the metal film 300 back to the incident side, a color image is displayed by controlling the alignment state of liquid crystal molecules of the liquid crystal 260. In such a reflective display device, even if a light source, such as a backlight, is not provided, display can be performed using ambient light, such as a fluorescent lamp or natural light, which is advantageous in view of power consumption, and thus it is widely used for mobile display devices, etc.

The color filter layer 320 for enabling the liquid crystal device to perform color display comprises a color filter layer of any one of three primary colors, i.e., blue, green, and red, and is disposed corresponding to each pixel (i.e., a dot which is referred to as a sub-pixel).

The color filter layer is generally formed by a dyeing method or a dye dispersion method. In the dyeing method, a polymeric material is applied to a substrate, patterning is performed by photolithography, followed by immersion in a dyeing bath to form a color filter layer of each color. In the dye dispersion method, a photosensitive resin in which a predetermined dye is dispersed so as to have any one of the primary colors is applied to a substrate, and patterning is performed to form a color filter layer of each color.

However, in the reflective liquid crystal device in which a color filter layer must be formed on a metal film, separations and defects of the color filter layer may occur due to insufficient adhesion between the metal film and the color filter layer. The reason for this is believed to be that since the color filter layer uses the polymeric material or the resin as a base, affinity for the metal is decreased.

Additionally, as a technique for improving adhesion between a metal and a resin, etc., the application of a primer on the surface of the metal has been known. However, if this technique is used for forming a color filter substrate, production efficiency is decreased due to an additional process step, and also, image quality may be degraded due to the primer.

It is an object of the present invention to provide a color filter substrate, a method of fabricating a color filter substrate, a liquid crystal device, a method of fabricating a liquid crystal device, and an electronic apparatus, in which the problems described above are overcome and adhesion between a reflecting layer and color filter layers can be improved without increasing the number of steps in the fabrication process.

SUMMARY OF THE INVENTION

In accordance with the present invention, in a color filter substrate having a plurality of pixels includes a reflecting layer composed of a metal film formed on a substrate, and any one of a blue color filter layer, a green color filter layer, and a red color filter layer formed on the reflecting layer at a position corresponding to each pixel. A metal complex of phthalocyanine is applied to the surface of the reflecting layer at the interface with the color filter layer.

In such a configuration, since the metal complex of phthalocyanine having superior adhesion with the reflecting layer and the color filter layer is applied to the surface of the reflecting layer and each color filter layer is formed thereon, the adhesion between the reflecting layer and the color filter layer can be improved.

Preferably, the blue color filter layer contains a dye composed of the metal complex of phthalocyanine.

Preferably, a shading film having a layered structure comprising the color filter layers of the individual colors is disposed on the surface of the reflecting layer between the individual pixels, a substrate-side layer in the shading film is the blue color filter layer, and the blue color filter layer contains a dye composed of the metal complex of phthalocyanine.

Preferably, an outermost layer in the shading film is the red color filter layer.

Preferably, a black shading film is disposed on the surface of the reflecting layer between the individual pixels, and the black shading film contains a dye composed of the metal complex of phthalocyanine.

Preferably, the metal complex of phthalocyanine is copper phthalocyanine.

Preferably, the reflecting layer at the position corresponding to each pixel is provided with a window for transmitting light.

In accordance with the present invention, a method of fabricating a color filter substrate having a plurality of discrete pixels, includes a first step of forming a blue color filter layer-forming film on a reflecting layer composed of a metal film formed on a substrate; a second step of forming a blue color filter layer on the reflecting layer at positions corresponding to predetermined pixels by patterning the blue color filter layer-forming film; a third step of forming a green or red color filter layer-forming film on the blue color filter layer and on the reflecting layer exposed in the second step; a fourth step of forming a green or red color filter layer on the reflecting layer exposed in the second step at positions corresponding to predetermined pixels by patterning the green or red color filter layer-forming film; a fifth step of forming a color filter layer-forming film of the color not selected in the third step on the blue color filter layer, on the green or red color filter layer, and on the reflecting layer exposed in the fourth step; and a sixth step of forming a color filter layer of the color not selected in the third step on the reflecting layer exposed in the fourth step at positions corresponding to predetermined pixels by patterning the color filter layer-forming film formed in the fifth step. The blue color filter layer contains a dye composed of a metal complex of phthalocyanine.

In such a configuration, when the blue color filter layer is formed on the reflecting layer and the blue color filter layer is then patterned, the metal complex of phthalocyanine having superior adhesion with the individual color filter layers is applied to the surface of the reflecting layer. Since the individual color filters are formed thereon, the adhesion between the reflecting layer and the individual color filter layers can be improved.

Preferably, in the second step, the blue color filter layer is formed on the reflecting layer between the individual pixels, in the fourth step, the green or red color filter layer is formed on the blue color filter layer between the individual pixels, and in the sixth step, the color filter layer of the color not selected in the third step is formed on the green or red color filter layer between the individual pixels, and thus a shading film having a layered structure comprising the color filter layers of the individual colors is formed, a substrate-side layer in the shading film being the blue color filter layer.

In such a configuration, since the blue color filter layer is formed first on the reflecting layer, the metal complex of phthalocyanine is applied to the surface of the reflecting layer, and since the shading film is formed by combining the individual color filter layers, a step for forming the shading film is not required, thus improving production efficiency.

Preferably, in the third step, the green color filter layer-forming film is formed.

In this way, since the red color filter layer is formed last among the individual color filter layers, it is possible to prevent residues from remaining when the red color filter layer is patterned, and therefore, the tone of the green color filter layer formed thereon is not impaired.

In accordance with the present invention, a method of fabricating a color filter substrate includes the steps of forming a black shading film-forming film containing a dye composed of a metal complex of phthalocyanine on a reflecting layer composed of a metal film formed on a substrate; forming a black shading film on the reflecting layer between the individual pixels by patterning the shading film-forming film; and forming any one of a blue color filter layer, a green color filter layer, and a red color filter layer on the reflecting layer at the position corresponding to each pixel before or after the black shading film-forming film is formed.

In accordance with the present invention, a liquid crystal device includes the color filter substrate described above and a counter substrate disposed opposite to the color filter substrate with a liquid crystal therebetween.

In accordance with the present invention, a method of fabricating a liquid crystal device includes the method of fabricating the color filter substrate described above.

In accordance with the present invention, an electronic apparatus includes the liquid crystal device described above.

DETAILED DESCRIPTION OF THE PREFERRED EMBODIMENTS

A color filter substrate in the present invention and a liquid crystal device including the color filter substrate will be described with reference to FIGS. 1 and 2. The "color filter substrate" in the present invention refers to one of a pair of substrates for constituting a liquid crystal device, which includes at least a reflecting layer, which will be described below, and color filter layers formed thereon. There is no particular limitation on the configuration of electrodes, which may be appropriately shaped depending on the operational mode of the liquid crystal device (i.e., a passive matrix driving system or active matrix driving system), etc. In the case of an active matrix liquid crystal device, as an active element to be connected to a pixel electrode, a TFT (thin film transistor) element which is a three-terminal element, a TFD (thin film diode) element which is a two-terminal element, and so on may be used.

Figure 1:
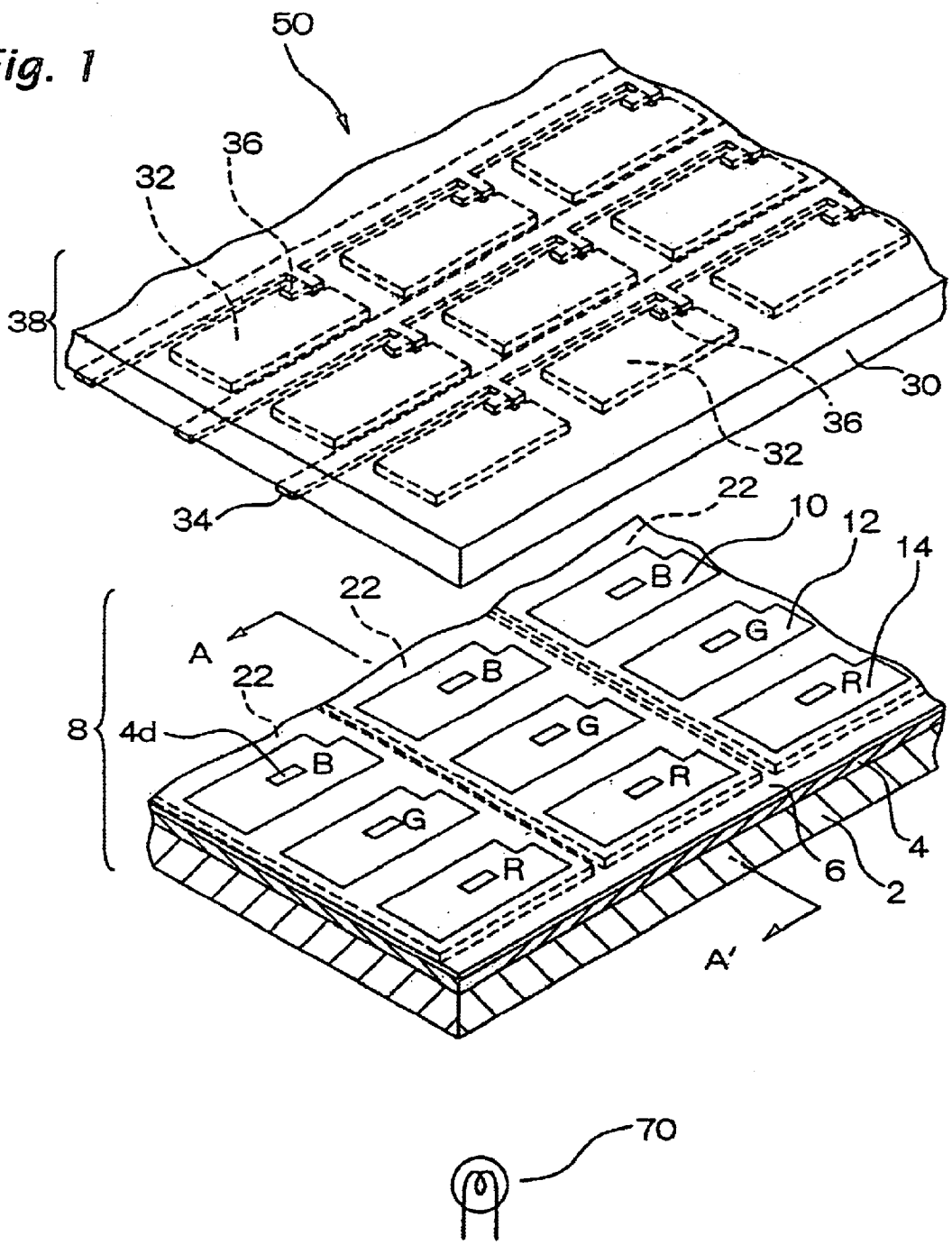
FIG. 1 is a perspective view showing a liquid crystal device and a color filter substrate which constitutes the liquid crystal device of the present invention.

As shown in FIG. 1, in a liquid crystal device 50, a color filter substrate 8 is disposed opposite to a counter substrate 38 with a predetermined spacing therebetween, and a liquid crystal is interposed between the substrates 8 and 38. In this embodiment, the liquid crystal device 50 is an active matrix liquid crystal display device in which a TFD (thin film diode) element is used as an active element. In the counter substrate 38, on the surface (the surface opposing the color filter substrate) of a transparent substrate 30 composed of a glass or the like, a plurality of pixel electrodes 32 composed of transparent electrodes, for example, ITO (indium tin oxide) and TFD elements 36 connected to the individual pixel electrodes 32 are formed. Each pixel electrode 32 is substantially rectangular, and one corner thereof is a cut-out to which the TFD element 36 is connected. The TFD elements 36 in a column or row are connected to a line 34 (although the line 34 is hereinafter referred to as a signal line 34, if the line 34 is a scanning line, a scanning line 22 becomes a signal line). Each TFD element 36 controls the alignment state of the liquid crystal in each pixel based on a voltage applied between the pixel electrode and the scanning line 22, which will be described below. Since the overall structure of the liquid crystal device 50 and the detailed operation for image display are the same as those in a conventional liquid crystal device, a description thereof will be omitted.

The color filter substrate 8 is fabricated as follows. First, a reflecting layer 4 composed of a metal film is formed on substantially all the surface of a transparent substrate 2 composed of a glass or the like, at least in a portion for constituting a display area (drive area). A blue color filter layer 10 (indicated by "B" in the drawing), a green color filter layer 12 (indicated by "G" in the drawing), and a red color filter layer 14 (indicated by "R" in the drawing) which constitute the individual pixels in a matrix are disposed on the reflecting layer 4 at positions opposing the pixel electrodes 32 of the counter substrate 38. The individual color filter layers 10, 12, and 14 are arranged separately, and shading films 6, which will be described below, are formed therebetween corresponding to non-display areas (non-drive areas in-which the pixel electrodes 32 are not formed). A protective layer not shown in the drawing is formed on the individual color filter layers 10, 12, and 14, and a plurality of scanning lines 22 which are rectangular and composed of ITO are formed on the protective film so as to be orthogonal to the direction in which the signal lines 34 extend.

As the metal film constituting the reflecting layer 4, a high-reflectivity material (for example, having a reflectivity of 90% or more), such as aluminum, silver, or an alloy thereof, may be used. The individual color filter layers 10, 12, and 14 may be formed by a dyeing method or a dye dispersion method, and when the dye dispersion method is employed, as a photosensitive resin (photoresist), for example, a color mosaic manufactured by Fuji Film Olin Co., Ltd. may be used. Dyes used for the individual color filter layers will be described below. Since the individual color filters constitute the three primary colors (R, G, and B) of light, preferably, the color filter layers of R, G, and B are alternately arranged in either direction. For example, in this embodiment, the color filter layers of R, G, and B are alternately arranged from left to right. However, the color filter layers of R, G, and B may be alternately arranged in a direction perpendicular to the above.

A small rectangular window 4d is formed in the reflecting layer 4 around the center of each of the color filter layers 10, 12, and 14 corresponding to pixels so that illuminating light from a backlight 70 disposed at the exterior of the color filter substrate 8 is transmitted to the side of the counter substrate 38. Although the configuration of the backlight 70 is not shown in detail in the drawing, in order to uniformly apply light at least to the overall display area of the liquid crystal device, a surface light source is preferably used. Examples of the surface light source are a surface light source which is converted from a point light source by a light guide plate, and an organic EL substrate are used as a surface light source.

In the liquid crystal display device 50, reflective display by the reflecting layer 4 is performed in the periphery of the individual color filter layers 10, 12, and 14, and transmissive display in which light emitted from the backlight 70 is transmitted through the windows 4d is performed in the center of the individual color filter layers 10, 12, and 14. By using such a structure, advantages of both the reflective device in which power consumption can be reduced and the transmissive device in which display can be performed regardless of the presence or absence of ambient light can be combined, and by switching the display mode depending on the condition of ambient light, a clear image can be displayed while reducing power consumption. Furthermore, by adjusting the aperture area of the window 4d, the image display area in the reflection display mode can be increased and image display area in the transmission display mode can be increased. There is no particular limitation on the shape and number of the windows.

Figure 2:
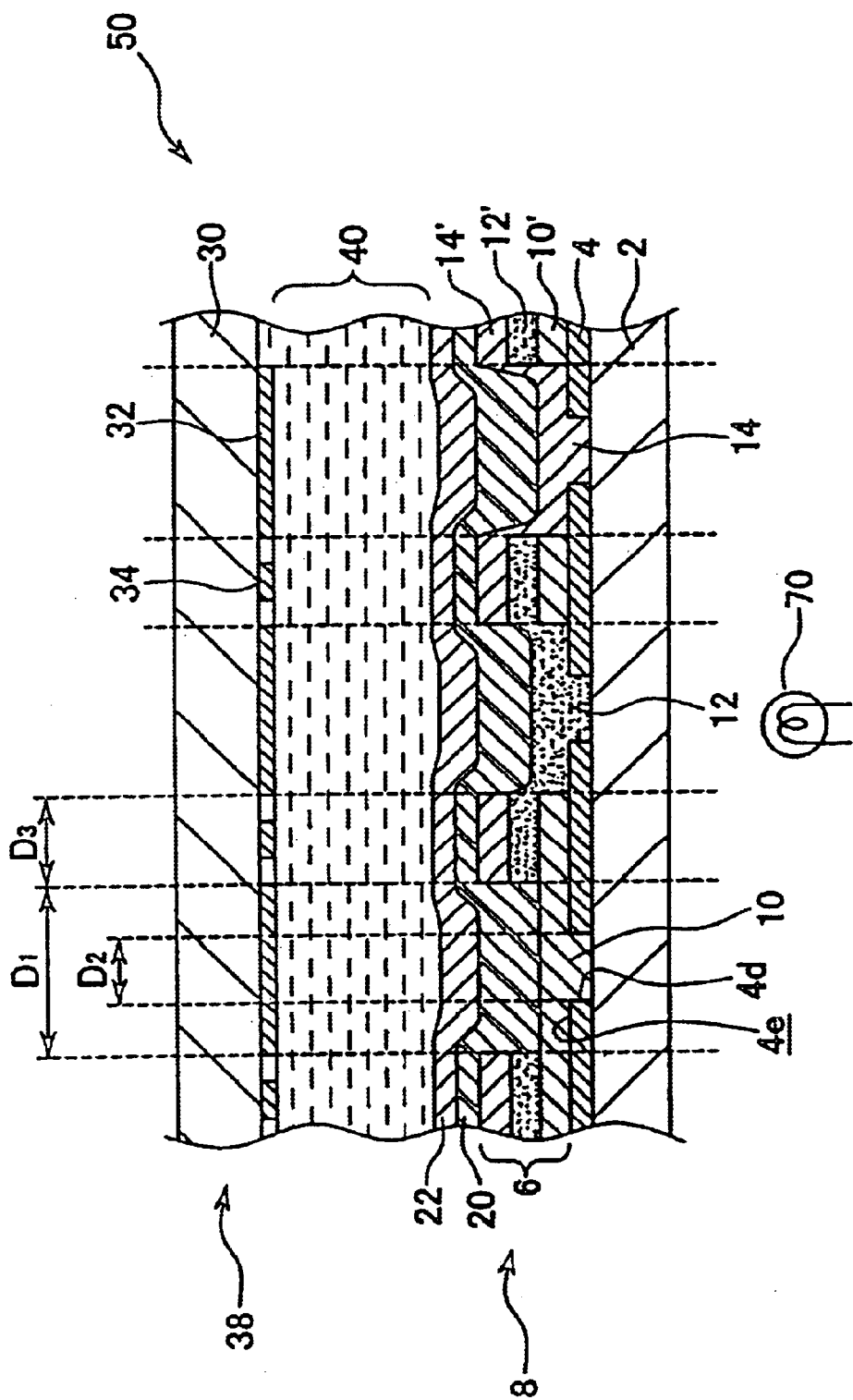
FIG. 2 is a sectional view taken along the line A–A' of FIG. 1.

FIG. 2 is a sectional view of the liquid crystal display device 50 (color filter substrate 8) taken along the line A–A' of FIG. 1.

In the drawing, the individual color filter layers 10, 12, and 14 which constitute the individual pixels and the individual color filter layers 10', 12', and 14' which constitute the shading film 6 are directly formed on the reflecting layer 4, and a metal complex of phthalocyanine, which will be described in detail below, is applied to a surface 4e of the reflecting layer 4 at the interface between the reflecting layer 4 and each color filter layer. Between the color filter layers 10, 12, and 14 corresponding to the individual pixels, color filter layers which are formed simultaneously with the color filter layers which constitute the individual pixels are deposited, and the overlapping portion constitutes the shading film 6. The shading film 6 includes the blue color filter layer 10' on the side of the reflecting layer 4 (as the lowest layer), on which the other color filter layers 12' and 14' are formed in that sequence. A protective layer 20 composed of, for example, an acrylic resin, is formed on the color filter layers 10, 12, and 14 and the shading film 6, and the scanning line 22 is formed on the protective layer 20.

Since all the primary colors of light entering the shading film 6 are absorbed by the color filter layers 10', 12', and 14', reflected light or transmitted light does not occur, and the shading film 6 acts as a black matrix (a region $D_3$ in the drawing). On the other hand, a region including the pixel electrode 32 corresponds to a display area (region $D_1$ in the drawing), which constitutes the pixel. In the pixel, a region including the window 4d constitutes a transmission display area (region $D_2$ in the drawing), and the remainder constitutes a reflection display area. Herein, the "pixel" in the present invention refers to an area in which the liquid crystal is substantially driven, i.e., a display area during reflection when the windows 4a are not formed, and an area consisting of a display area during transmission and a display area during reflection when the windows 4a are formed. The adjacent pixels are separated from each other so that the liquid crystal is driven independently in each pixel.

The present invention has a feature in that adhesion between the reflecting layer composed of the metal film and the individual color filter layers is improved based on knowledge described below. The knowledge is that while the blue color filter layer and the black resin shading film (black matrix) have excellent adhesion with the reflecting layer, the red and green color filter layers have inferior adhesion with the reflecting layer in comparison with the blue color filter layer and the black resin shading film. It is also known that after a blue color filter layer formed on a reflecting layer is removed, if a green or red color filter layer is formed on the removed portion, adhesion with the reflecting layer improves.

Herein, although the blue color filter layer and the black shading film are found to contain a dye (pigment) composed of a metal complex of phthalocyanine, the red and green color filter layers do not contain a large amount of the pigment. This fact will be described with reference to pigments which are generally used for the individual color filter layers. First, for the blue color filter layer 10, a blue pigment (chemical formula 1) composed of copper phthalocyanine, which is specified as "Pigment Blue 15:6" in the color index (hereinafter referred to as "C.I."), is used.

[Chemical Formula 1]

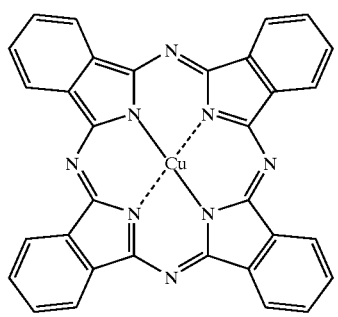

For the green color filter layer 12, a green pigment (chemical formula 2) specified as "C.I. Pigment Green 36" composed of a derivative (halogen-substituted product) of copper phthalocyanine and a yellow pigment (chemical formula 3) specified as "C.I. Pigment Yellow 150" are used.

[Chemical Formula 2]

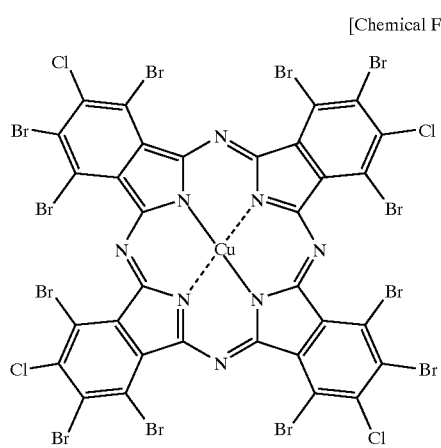

[Chemical Formula 3]

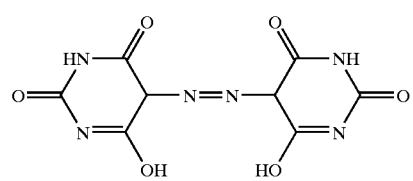

For the red color filter layer 14, a red pigment (chemical formula 4) specified as "C.I. Pigment Red 209" is used.

[Chemical Formula 4]

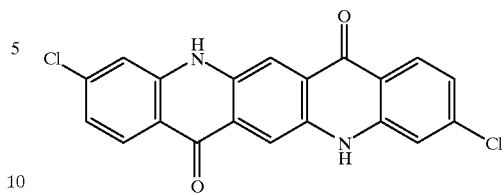

Furthermore, the shading film contains the blue pigment, "C.I. Pigment Blue 15:6", and the green pigment, "C.I. Pigment Green 36", and also contains, as necessary, a red pigment (e.g., "C.I. Pigment Red 177") and carbon black.

As is clear from the above, both the blue color filter layer and the shading film contain "C.I. Pigment Blue 15:6", i.e., the metal complex of phthalocyanine, which is believed to improve the adhesion with the reflecting layer composed of the metal film.

Even if the blue color filter layer is removed from the reflecting layer, the metal complex of phthalocyanine adheres to and remains on the surface of the reflecting layer. Therefore, when a green or red color filter layer is formed on the removed portion, the adhesion between such a color filter layer and the reflecting layer is believed to improve.

Additionally, although the green color filter layer 12 contains the halogen-substituted product of copper phthalocyanine (substitution number 16), it does not improve the adhesion with the reflecting layer. Accordingly, in the present invention, a "metal complex of phthalocyanine" is defined as an unsubstituted product of a metal complex of phthalocyanine, which, in principle, does not include the one into which a halogen or the like is substituted. However, "C.I. Pigment Blue 15:1" and "C.I. Pigment Blue 15:2" are monochloro-substitution products of a metal complex of phthalocyanine and are used as blue pigments. Therefore, in the present invention, the metal complex of phthalocyanine may include a metal complex of phthalocyanine which is substituted with a substitution number of 1.

The metal complex of phthalocyanine improves the adhesion between the reflecting layer and the individual color filter layers because metal ions coordinated with the metal complex of phthalocyanine are believed to improve the affinity for the reflecting layer (metal film). On the other hand, the organic constitution (phthalocyanine) of the metal complex of phthalocyanine is believed to improve the affinity for the base (a polymeric material or resin) of each color filter layer.

As the metal complex of phthalocyanine, for example, the copper phthalocyanine and the monochloro-substitution product thereof described above may be used.

Although the detailed fabrication method will be described below, a dye (blue pigment) composed of the metal complex of phthalocyanine is incorporated with the blue color filter layer 10 and the blue color filter layer 10 is formed over the entire surface of the reflecting layer, and patterning is then performed. Thus, the metal complex of phthalocyanine can be applied to the surface of the reflecting layer. By forming the other color filter layers 12 and 14 on the reflecting layer which has been treated as described above, the adhesion can be improved.

Although either the red color filter layer 14 or the green color filter layer 12 may be formed on the blue color filter layer 10, when the red color filter layer 14 is formed and is then removed, residues remain, and the tone of the green color filter layer 12 subsequently formed thereon may be impaired. Therefore, preferably, the green color filter layer is formed after the blue color filter layer 10 is formed and lastly the red color filter layer is formed. In such a case, the red color filter layer 14' is located as an outermost layer of the shading film 6.

Next, a method of fabricating the color filter substrate 8 described above will be described with reference to FIGS. 3 to 5. FIGS. 3 to 5 are sectional views taken along the line A–A' of FIG. 1, the same as FIG. 2, which illustrate the individual layers of the color filter substrate 8 in the individual steps. In the fabrication method in the present invention, "to be formed on the reflecting layer 4" means that the reflecting layer 4 may include the windows 4d.

First, the substrate 2 composed of a glass or the like provided with the reflecting layer 4 composed of an aluminum film or the like (approximately 200 nm thick) on the surface is prepared. The reflecting layer 4 may be formed, for example, by sputtering. When a transflective liquid crystal device is fabricated, windows 4d may be formed in the reflecting layer 4 at predetermined positions corresponding to the individual pixels. Furthermore, a substrate protective layer composed of a silicon oxide film or the like may be preliminarily formed on the surface of the substrate 2.

Figure 3A:
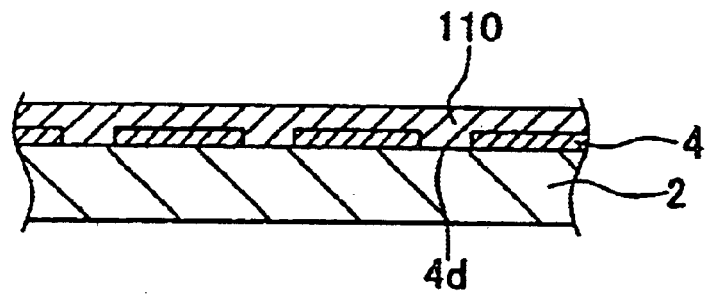
FIGS. 3(A) to (D) are sectional views which illustrate the steps in the fabrication process of the color filter substrate.

As shown in FIG. 3(A), by applying a photoresist (photosensitive resin), in which a blue pigment composed of "C.I. Pigment Blue 15:6" (copper phthalocyanine) is dispersed, to the surface of the reflecting layer 4 including the windows 4d, a blue color filer layer-forming film 110 is formed (first step).

Figure 3B:
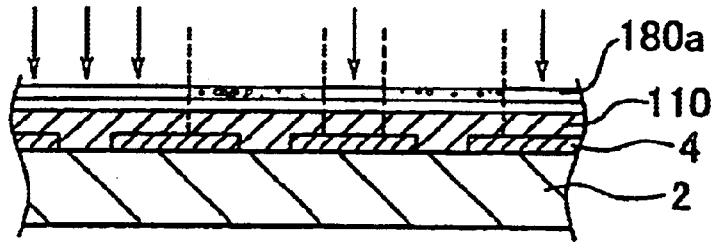
Figure 3C:
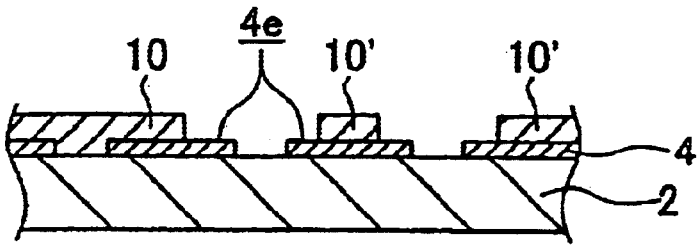

Next, as shown in FIG. 3(B), exposure is performed with a predetermined mask 180a being placed on the blue color filter layer-forming film 110, and the unexposed resist is removed using an alkali or the like, followed by patterning. By appropriately firing the remaining film, as shown in FIG. 3(C), the blue color filter layer 10 which constitutes the pixel and the blue color filter layer 10' which constitutes the shading film are formed (second step). In such a case, copper phthalocyanine is believed to adhere to surfaces 4e of the reflecting layer 4 exposed in this step. Additionally, the region for forming the blue color filter layer includes, specifically, a portion 10 (in the left end of the drawing) which primarily acts as a color filter corresponding to each pixel and a portion 10' (in the center and the right end of the drawing) for forming a shading film (black matrix) provided in a net-like pattern between the color filter layers 10, 12, and 14 corresponding to the individual pixels.

Figure 3D:
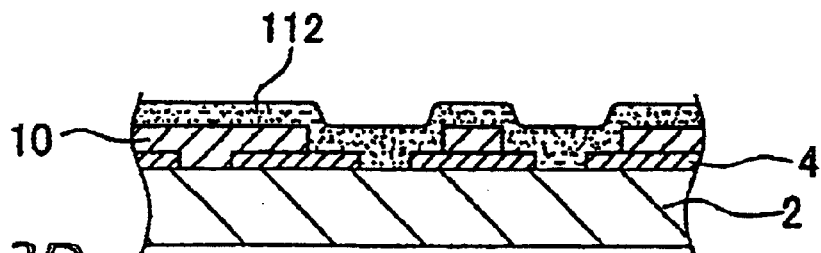

Next, as shown in FIG. 3(D), a green color filter, layer-forming film 112 is formed on the blue color filter layer 10 and the reflecting layer 4 (including the windows 4d) which is exposed in the second step (third step). Herein, as the film 112, a predetermined photoresist in which a green pigment, such as "C.I. Pigment Green 36", and a yellow pigment, such as "C.I. Pigment Yellow 150", are dispersed may be used.

Figure 4A:
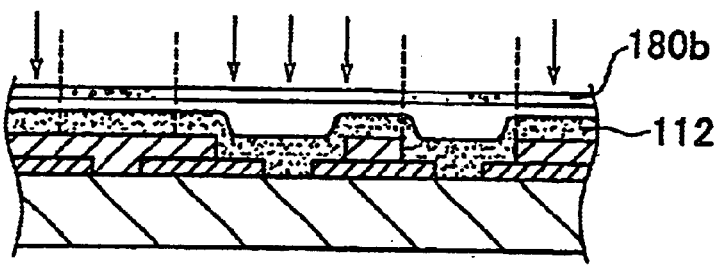
FIGS. 4(A) to (D) are sectional views which illustrate the subsequent steps to those in FIG. 3.
Figure 4B:
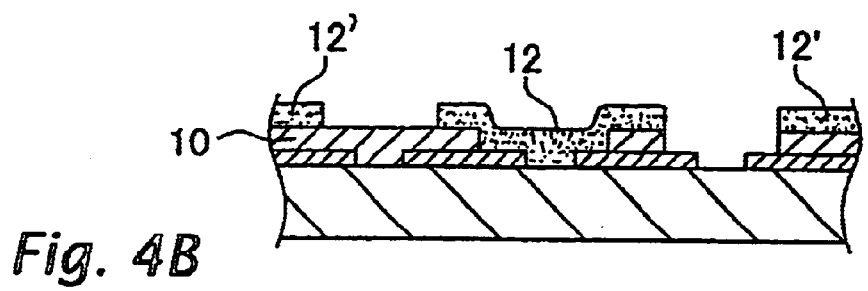

As shown in FIG. 4(A), exposure and patterning are performed with a predetermined mask 180b being placed on the green color filter layer-forming film 112 in a similar manner as that described above, and thus the green color filter layer 12 which constitutes the pixel and the green color filter layer 12' which constitutes the shading film are formed (fourth step). Additionally, the region for forming the green color filter layer includes, specifically, a portion 12 (in the center of the drawing) which primarily acts as a color filter and a portion 12' (in the left and right ends and the periphery of the center in the drawing) for forming a shading film.

Figure 4C:
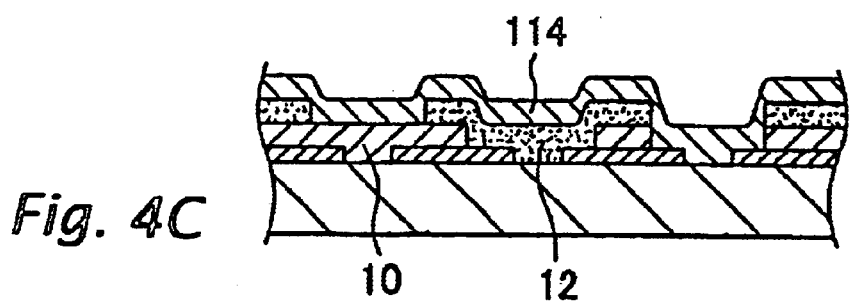

Next, as shown in FIG. 4(C), a color filter layer-forming film 114 of the color (red) which is not selected in the third step is formed on the blue color filter layer 10, on the green color filter layers 12 and 12', and on the reflecting layer 4 exposed in the fourth step (fifth step). Herein, as the film 114, a photoresist in which a red pigment composed of, for example, "C.I. Pigment Red 209" is dispersed may be used.

Figure 4D:
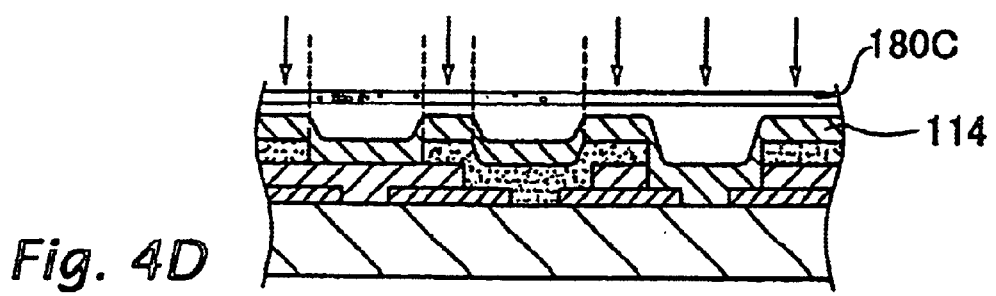
Figure 5A:
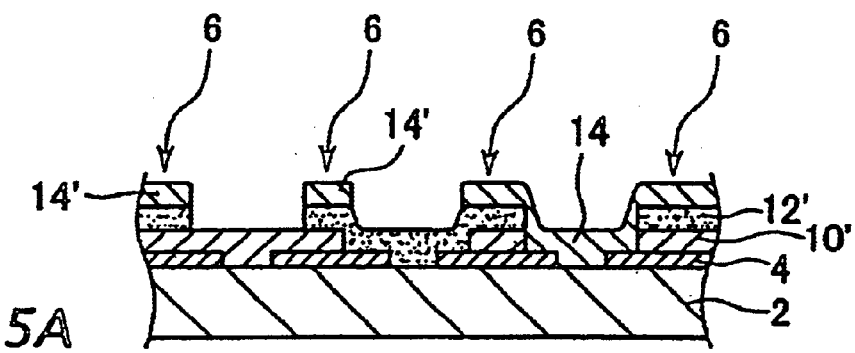
FIGS. 5(A) and (B) are sectional views which illustrate the subsequent steps to those in FIG. 4.
Figure 5B:
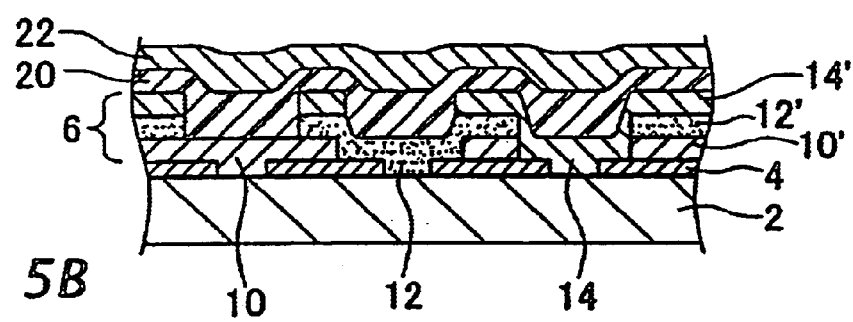

As shown in FIG. 4(D), exposure and patterning are performed with a predetermined mask 180C being placed on the red color filter layer-forming film 114 in a similar manner as that described above, and thus the red color filter layer 14 which constitutes the pixel and the red color filter layer 14' which constitutes the shading film shown in FIG. 5(A) are formed. In the portion for forming the shading film, the individual color filter layers 10', 12', and 14' are deposited, and the shading film 6 is formed in which the blue color filter layer 10' lies nearest to the substrate (in the bottom) (sixth step).

Furthermore, the protective film 20 (approximately 2 μm thick) composed of an acrylic resin is formed on the individual color filter layers 10, 12, and 14 and the shading film 6, and rectangular scanning lines 22 (approximately 150 nm thick) composed of a transparent material, such as ITO (indium tin oxide), are formed thereon, and thus the color filter substrate 8 of the present invention can be obtained (refer to FIG. 5 (10)). In addition, an alignment film may be formed on the outermost surface of the color filter substrate 8. Since the green and red color filter layers 12 and 14 are formed on the reflecting layer 4 in which copper phthalocyanine adheres to the surface 4e, the adhesion between the reflecting layer 4 and the individual color filter layers 10, 12, and 14 can be improved. Although the blue color filter layer, the green color filter layer, and the red color filter layer are formed in that order in the embodiment described above, the red color filter layer may be formed before the green color filter layer is formed.

Figure 6:
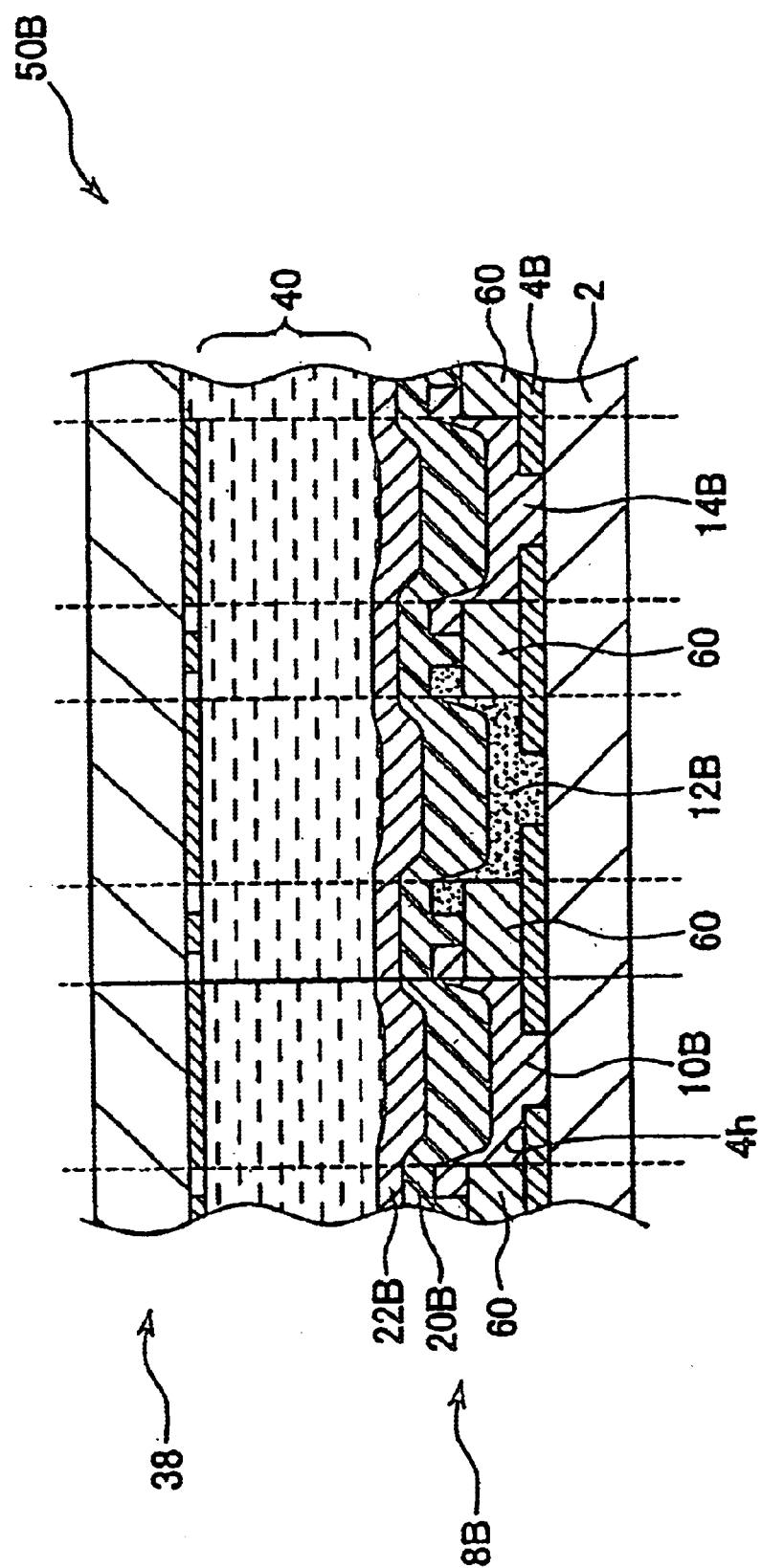
FIG. 6 is a partial sectional view of a liquid crystal device and a color filter substrate which constitutes the liquid crystal device in another embodiment of the present invention.
Figure 7:
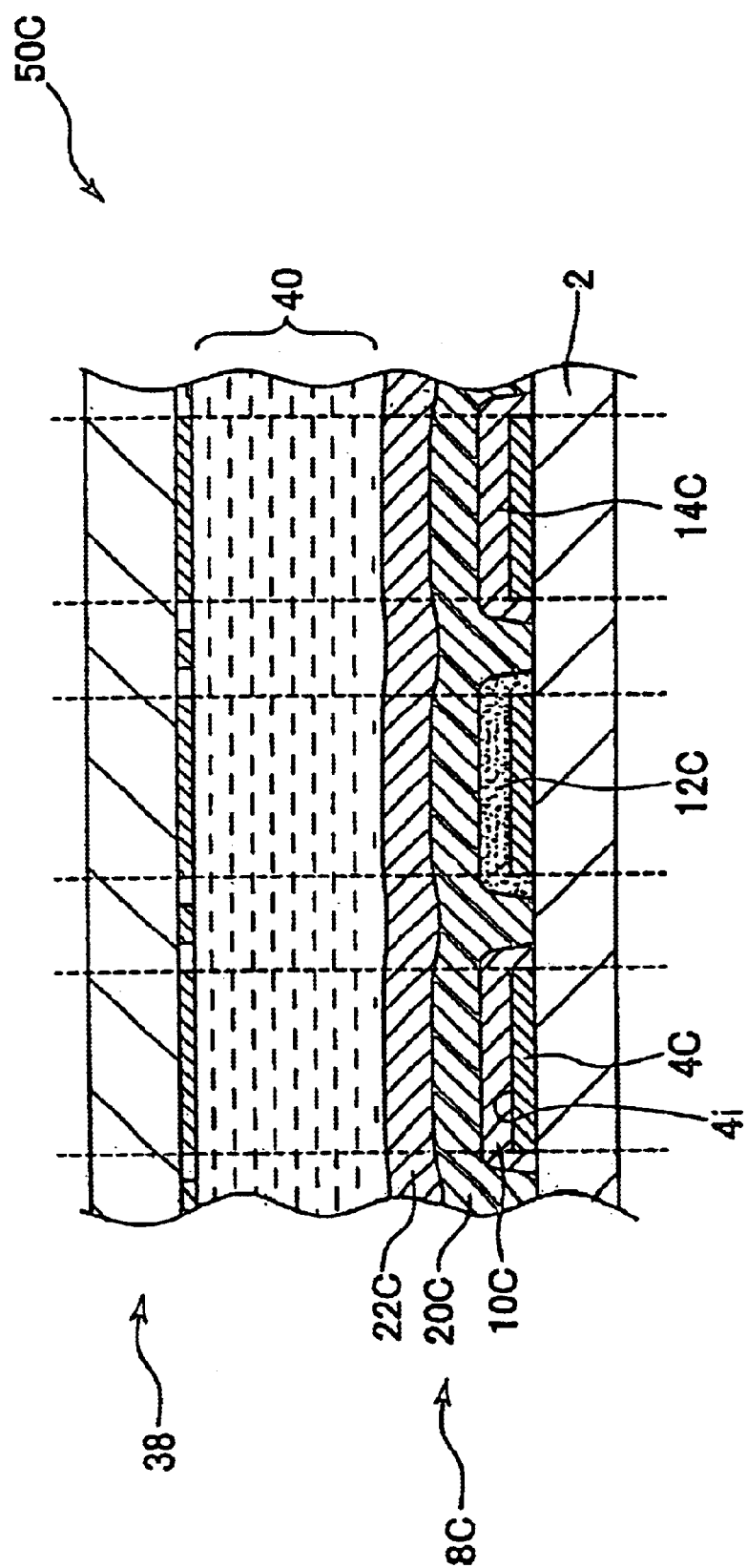
FIG. 7 is a partial sectional view of a liquid crystal device and a color filter substrate which constitutes the liquid crystal device in another embodiment of the present invention.

As described above, in the present invention, the individual color filter layers are formed on the reflecting layer while the metal complex of phthalocyanine is applied to the surface of the reflecting layer, and it is to be understood that the invention is not limited to the embodiment described above within the scope not deviating from the object of the invention. Other embodiments will be described with reference to FIGS. 6 and 7. FIGS. 6 and 7 show active matrix liquid crystal display devices 50B and 50C using TFD elements as active elements provided with color filter substrates 8B and 8C, respectively. Since the liquid crystal display devices 50B and 50C are the same as the liquid crystal display device 50 described above apart from the fact that the color filter substrates 8B and 8C have different configurations, a description thereof will be omitted.

The embodiment shown in FIG. 6 differs from the embodiment shown in FIG. 1 in that a black resin shading film is used as the shading film. A color filter substrate 8B is constructed as described below. First, a reflecting layer 4B provided with predetermined windows is formed on the surface of a substrate 2, and a black shading film 60 is formed in a grid-like pattern at positions corresponding to areas in which pixel electrodes 32 of a counter substrate 38 are not formed. The individual color filter layers 10B, 12B, and 14B are formed on the reflecting layer in regions surrounded by the shading film 60, and the periphery of each color filter layer extends to cover edges of the shading film. A protective layer 20B is formed on the individual color filter layers and the shading film 60, and rectangular scanning lines 22B are formed thereon.

The color filter substrate 8B is fabricated in a manner outlined below. First, after a shading film-forming film is formed over the entire surface of the reflecting layer 4B of the substrate 2, the shading film 60 is formed by patterning. The shading film 60 contains at least a blue pigment composed of a metal complex of phthalocyanine, and also contains, as necessary, a green pigment, a yellow pigment, a red pigment, and carbon black, and the shading film 60 appears to be black overall. Therefore, when the shading film 60 is formed over the entire surface of the reflecting layer 4B, the metal complex of phthalocyanine remains on and adheres to the surface 4h of the reflecting layer 4B. At the predetermined positions of the reflecting layer 4B, the blue, green, and red color filter layers 10B, 12B, and 14B are formed, and the protective layer 20B and the scanning lines 22B are formed thereon, and thus the color filter substrate 8B is obtained. As described above, in this embodiment, since the metal complex of phthalocyanine is applied to the surface 4h of the reflecting layer 4B when the shading film is preliminarily formed, it is not necessary to form the blue color filter layer 10B first, and the individual color filter layers can be formed in any sequence.

Next, the color filter 8C will be described with reference to FIG. 7. On a substrate 2, a plurality of reflecting layers 4C are formed in a matrix at positions corresponding to pixel electrodes 32 of a counter substrate 38. Any one of color filter layers 10C, 12C, and 14C is formed on each reflecting layer 4C, and the periphery of each color filter layer covers edges of the reflecting layer 4C. A protective layer 20C is formed on the individual color filter layers and the substrate 2, and scanning lines 22C are formed thereon. Although a shading film is not formed on the color filter substrate 8C, incident light is not reflected by the section between the individual reflecting layers 4C, which corresponds to a black matrix for blocking light.

In this embodiment, by forming a blue color filter layer-forming film first on the reflecting layer 4C, followed by patterning, a metal complex of phthalocyanine is applied to a surface 4i of the reflecting layer 4C, and the green and red color filter layers are then formed, and thus the adhesion between the reflecting layer and the individual color filter layers can be improved, the same as the previous embodiments.

Additionally, although the electrode is disposed on the reflecting layer on the side of the color filter substrate in the individual embodiments, the reflecting layer itself may be used as the electrode.

With respect to the color filter substrate and the liquid crystal device of the present invention, various alterations can be made within the scope not deviating from the object of the invention.

In the embodiment, although the blue color filter layer, the green color filter layer, and the red color filter layer are described, any types of color filter layers, such as a cyan color filter layer, magenta color filter layer or yellow color filter layer can be employed.

The number of color filter layers is not limited to three. For example, two or four color filter layers can be utilized.

Although the liquid crystal device using TFD elements as active elements is described in the embodiments described above, TFT elements may be disposed on the counter substrate 38 instead of the TFD elements. In such a case, a common electrode is arranged instead of the scanning lines 22 on the side of the substrate 2.

Furthermore, although the surface of the reflecting layer is specular in the embodiments described above, the present invention is not limited to this. The surface of the reflecting layer on the liquid crystal side may be uneven so as to scatter reflected light. In such a case, the scattering surface may be formed by one of two methods described below. In a first method, the reflecting substrate itself is formed so as to have an uneven surface, and the reflecting layer is formed thereon. The surface of the reflecting layer is made to reflect the uneven surface of the substrate so that the reflecting layer has an uneven surface. In a second method, the reflecting substrate itself is formed so as to be specular, and the surface of the reflecting layer is formed so as to have unevenness.

The material for constituting the reflecting layer is not limited to aluminum or an aluminum alloy, and for example, silver or a silver alloy may be used. As the silver alloy, an Ag—Pd—Cu alloy may be used.

In the embodiments shown in FIGS. 1 and 6, although the transflective liquid crystal device which enables both a reflection display and a transmission display is described, a reflective liquid crystal device may be acceptable in which windows 4d for transmitting light are not formed in the reflecting layer.

In the embodiment shown in FIG. 7, although the reflective liquid crystal display device in which windows are not provided on the reflecting layers corresponding to the pixels is described, a transflective liquid crystal device may be acceptable in which a window is provided in each reflecting layer corresponding to a pixel.

Next, examples of an electronic apparatus provided with the liquid crystal device of the present invention will be described.

Figure 8:
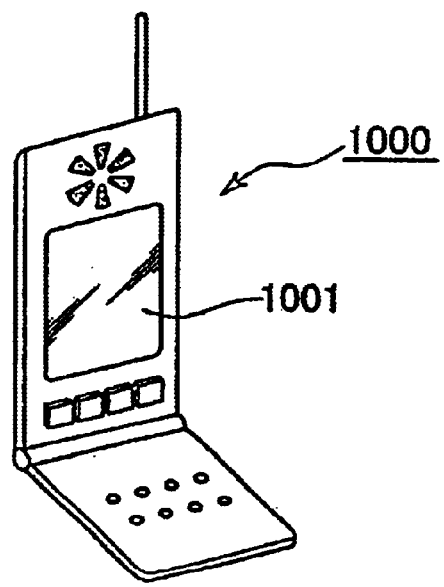
FIG. 8 is a perspective view of an example of an electronic apparatus using the liquid crystal device of the present invention.

FIG. 8 is a perspective view of a cellular telephone.

In FIG. 8, numeral 1000 represents a cellular telephone body, and numeral 1001 represents a liquid crystal display area using the liquid crystal device described above.

Figure 9:
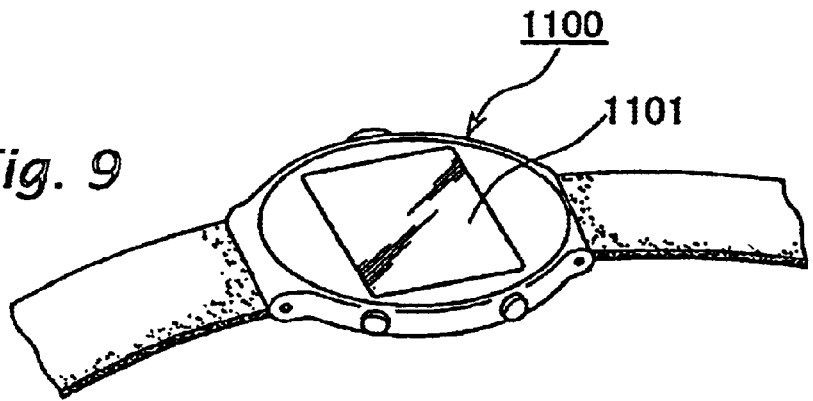
FIG. 9 is a perspective view of another example of the electronic apparatus.

FIG. 9 is a perspective view of a wristwatch-type electronic apparatus.

In FIG. 9, numeral 1100 represents a watch body, and numeral 1101 represents a liquid crystal display area using the liquid crystal device described above.

Figure 10:
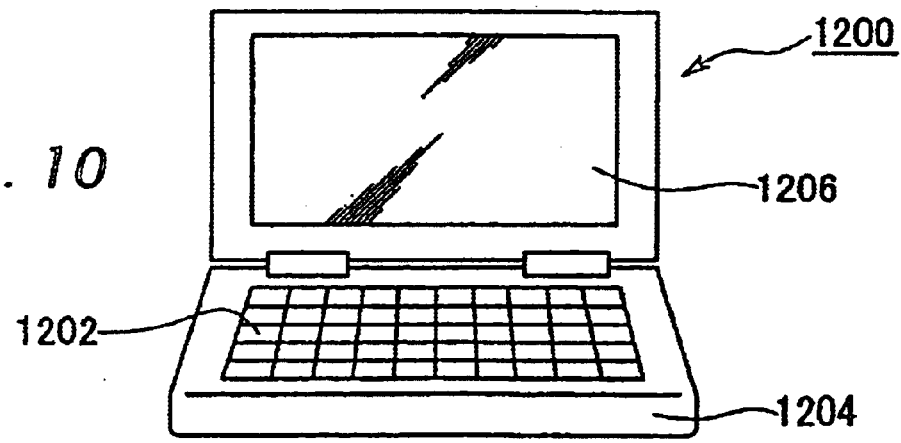
FIG. 10 is a perspective view of another example of the electronic apparatus.
Figure 11:
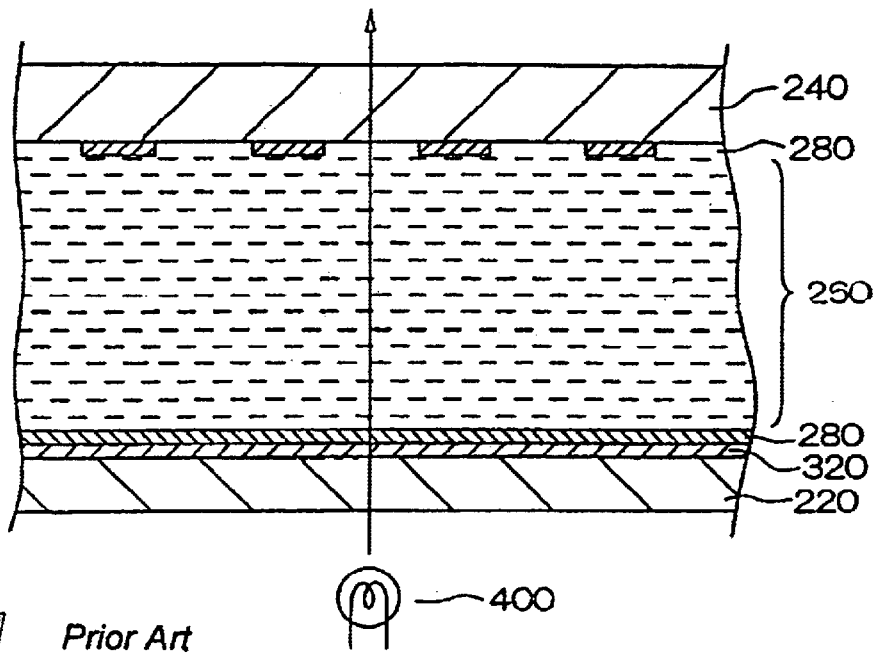
FIG. 11 is a partial sectional view of a conventional transmissive liquid crystal display device.
Figure 12:
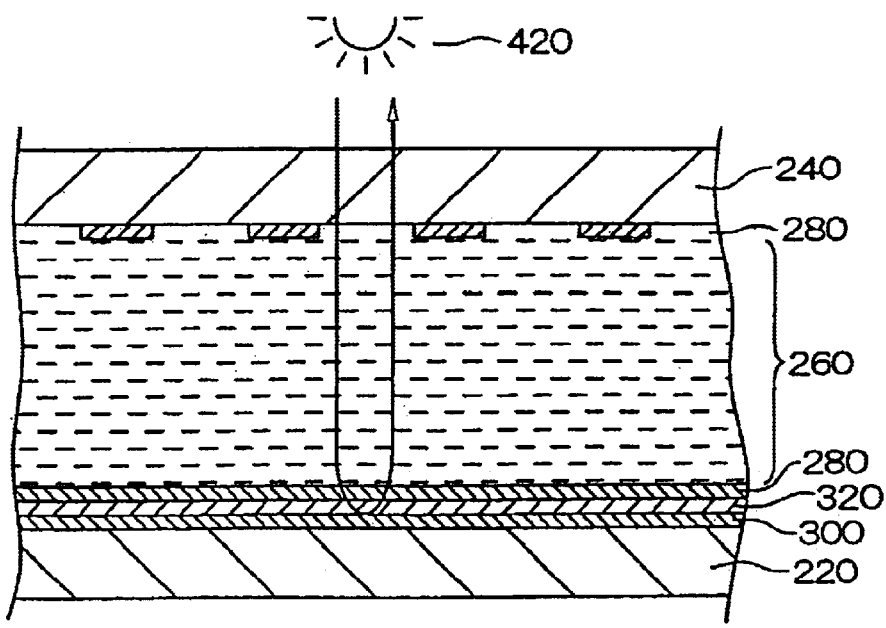
FIG. 12 is a partial sectional view of a conventional reflective liquid crystal display device.

FIG. 10 is a perspective view of a mobile information processing unit, such as a word processor or a personal computer.

In FIG. 10, numeral 1200 represents an information processing unit, numeral 1202 represents an input unit, such as a keyboard, numeral 1204 represents an information processing unit body, and numeral 1206 represents a liquid crystal display area using the liquid crystal device described above.

Since the electronic apparatuses shown in FIGS. 8 to 10 are provided with the liquid crystal display areas using the liquid crystal devices described above, electronic apparatuses having high yields and superior image quality can be obtained.

As described above, in accordance with the present invention, since the metal complex of phthalocyanine which has superior adhesion to the reflecting layer and the individual color filter layers is applied to the surface of the reflecting layer, and the individual color filter layers are formed thereon, adhesion between and the reflecting layer and the color filter layers can be improved. Since this effect can be achieved without increasing the number of steps in the fabrication process, production efficiency or yields will not be decreased.

In accordance with the fabrication method of the present invention, by forming the blue color filter layer or the black shading film first on the reflecting layer, followed by patterning, the metal complex of phthalocyanine which has superior adhesion to the individual color filter layers and the black shading film adheres to the surface of the reflecting film. Since the color filter layers, etc. are formed thereon, adhesion between the reflecting layer and the individual color filter layers (black shading film) can be improved.

What is claimed is:

1. A color filter substrate having a plurality of pixels for constituting a display area, comprising:
   a reflecting layer including a metal film formed on a substrate; and
   a color filter layer selected from any one of a blue color filter layer, a green color filter layer, and a red color filter layer formed on the reflecting layer at a position corresponding to each of the pixels,
   wherein:
     a metal complex of phthalocyanine is applied to a surface of the reflecting layer at an interface with the color filter layer;
     a shading film having a layered structure comprising the blue, green, and red color filter layers is disposed on the surface of the reflecting layer between the individual pixels;
     a substrate-side layer in the shading film is the blue color filter layer;
     the blue color filter layer contains a dye comprising the metal complex of phthalocyanine; and
     an outermost layer in the shading film is the red color filter layer.

2. The color filter substrate according to claim 1, wherein a black shading film is disposed on the surface of the reflecting layer between the individual pixels, and the black shading film contains a dye comprising the metal complex of phthalocyanine.

3. The color filter substrate according to claim 1, wherein the metai complex of phthalocyanine is copper phthalocyanine.

4. The color filter substrate according to claim 1, wherein the reflecting layer at the position corresponding to each of the pixels is provided with a window for transmitting light.

5. A liquid crystal device comprising a color filter substrate according to claim 1 and a counter substrate disposed opposite to the color filter substrate with a liquid crystal therebetween.

6. An electronic apparatus comprising a liquid crystal device according to claim 5.

7. A method of fabricating a color filter substrate having a plurality of pixels, comprising:
   a first step of forming a blue color filter layer-forming film on a reflecting layer including a metal film formed on a substrate;
   a second step of forming a blue color filter layer on the reflecting layer at positions corresponding to predetermined pixels by patterning the blue color filter layer-forming film;
   a third step of forming a green or red color filter layer-forming film on the blue color filter layer and on the reflecting layer exposed in the second step;
   a fourth step of forming a green or red color filter layer on the reflecting layer exposed in the second step at positions corresponding to predetermined pixels by patterning the green or red color filter layer-forming film;
   a fifth step of forming a color filter layer-forming film of the color not selected in the third step on the blue color filter layer, on the green or red color filter layer, and on the reflecting layer exposed in the fourth step; and
   a sixth step of forming a color filter layer of the color not selected in the third step on the reflecting layer exposed in the fourth step at positions corresponding to predetermined pixels by patterning the color filter layer-forming film formed in the fifth step,
   wherein the blue color filter layer contains a dye comprising a metal complex of phthalocyanine.

8. The method of fabricating a color filter substrate according to claim 7, wherein in the second step, the blue color filter layer is formed on the reflecting layer between the individual pixels, in the fourth step, the green or red color filter layer is formed on the blue color filter layer between the individual pixels, and in the sixth step, the color filter layer of the color not selected in the third step is formed on the green or red color filter layer between the individual pixels, and thus a shading film having a layered structure comprising the blue, green, and red color filter layers is formed, a substrate-side layer in the shading film being the blue color filter layer.

9. The method of fabricating a color filter substrate according to claim 7, wherein, in the third step, the green color filter layer-forming film is formed.

10. A method of fabricating a liquid crystal device comprising a method of fabricating a color filter substrate according to claim 7.

11. A color filter substrate having a plurality of pixels for constituting a display area, comprising:
    a reflecting layer including a metal film formed on a substrate;
    a color filter layer formed on the reflecting layer at a position corresponding to each of the pixels; and
    a metal complex of phthalocyanine applied to a surface of the reflecting layer at an interface with the color filter layer:
    wherein:
      a black shading film is disposed on a surface of the reflecting layer between the individual pixels;
      the black-shading film contains a dye comprising the metal complex of phthalocvanine; and
      the black-shading film is formed as a different layer as the color filter layer.

12. The color filter substrate according to claim 11, wherein the color filter layer comprises a plurality of color filters, each color of the color filters is different from each other.

13. The color filter substrate according to claim 11, wherein the metal complex of phthalocyanine further comprises copper phthalocyanine.

14. The color filter substrate according to claim 11, wherein the reflecting layer at the position corresponding to each of the pixels is provided with a window for transmitting light.

15. A method of fabricating a color filter substrate having a plurality of pixels, compromising:
    a step of forming a color filter layer-forming film on a reflecting layer including a metal film formed on a substrate; and
    a step of forming a second color filter layer-forming film on the reflecting layer, a color of the second color filter layer being different from the blue filter layer, the second filter layer-forming film being formed after the step of forming the blue filter layer-forming film which contains a phthalocyanine therein.

16. A method of fabricating a color filter substrate having a plurality of pixels comprising the steps of:

forming a black shading film-forming film on a reflecting layer including a metal film formed on a substrate, the shading film-forming film containing a dye including a metal complex of phthalocyanine;

patterning the shading film-forming film so that the shading film-forming film remains between the individual pixels; and forming a color filter layer on the reflecting layer at a position corresponding to each pixel before or after the black shading film-forming film is formed.

17. The method of fabricating a color filter substrate according to claim 16, wherein the color filter layer further comprises at least one of the group consisting of:

a blue color filter layer, a green color filter layer, and a red color filter layer.

18. A liquid crystal device comprising:

a color filter substrate including a reflecting layer including a metal film;

a color filter layer formed on the reflecting layer;

a metal complex of phthalocyanine applied to a surface of the reflecting layer at an interface with the color filter layer;

a counter substrate disposed opposite to the color filter substrate;

a liquid crystal positioned between the color filter substrate and the counter substrate: and a black matrix on the reflecting layer is formed as a different layer as the color filter layer.

* * * * *